(12) United States Patent
Anderson et al.

(10) Patent No.: US 8,557,624 B2
(45) Date of Patent: Oct. 15, 2013

(54) PIXEL SENSOR CELLS WITH A SPLIT-DIELECTRIC TRANSFER GATE

(75) Inventors: Brent A. Anderson, Jericho, VT (US); Andres Bryant, Burlington, VT (US); William F. Clark, Jr., Essex Junction, VT (US); John Joseph Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 13/005,650

(22) Filed: Jan. 13, 2011

(65) Prior Publication Data

US 2012/0181588 A1 Jul. 19, 2012

(51) Int. Cl.
| | |
|---|---|
| *H01L 21/00* | (2006.01) |
| *H01L 31/113* | (2006.01) |
| *G06F 17/50* | (2006.01) |
| *H01L 31/18* | (2006.01) |

(52) U.S. Cl.
USPC .............. 438/57; 438/98; 438/275; 438/287; 438/591; 257/E21.001

(58) Field of Classification Search
USPC ................................ 438/57, 98; 257/E21.001
See application file for complete search history.

(56) References Cited

U.S. PATENT DOCUMENTS

| | | |
|---|---|---|
| 6,037,224 A | 3/2000 | Buller et al. |
| 6,281,064 B1 | 8/2001 | Mandelman et al. |
| 6,333,220 B1 | 12/2001 | Mandelman et al. |
| 6,335,248 B1 | 1/2002 | Mandelman et al. |
| 6,432,787 B1 | 8/2002 | Mandelman et al. |
| 6,535,056 B2 | 3/2003 | Mizuno |
| 6,639,455 B2 | 10/2003 | Mizuno |
| 6,765,434 B2 | 7/2004 | Mizuno |
| 6,855,604 B2 | 2/2005 | Lee |
| 6,946,694 B2 * | 9/2005 | Okamoto et al. ............. 257/222 |
| 6,970,036 B2 | 11/2005 | Mizuno |
| 7,161,414 B2 | 1/2007 | Mizuno |
| 2002/0028559 A1 | 3/2002 | Mandelman et al. |
| 2002/0139933 A1 * | 10/2002 | Iida et al. .................... 250/338.1 |
| 2006/0226456 A1 * | 10/2006 | Adkisson et al. ............. 257/291 |
| 2008/0035969 A1 * | 2/2008 | Ko et al. ........................ 257/292 |
| 2008/0079043 A1 * | 4/2008 | Kim et al. ..................... 257/292 |
| 2009/0236498 A1 * | 9/2009 | Nagaraja et al. ........... 250/208.1 |

\* cited by examiner

*Primary Examiner* — Angel Roman
(74) *Attorney, Agent, or Firm* — Wood, Herron & Evans LLP; Anthony J. Canale

(57) ABSTRACT

Pixel sensor cells, methods of fabricating pixel sensor cells, and design structures for a pixel sensor cell. A transistor in the pixel sensor cell has a gate structure that includes a gate dielectric with a thick region and a thin region. A gate electrode of the gate structure is formed on the thick region of the gate dielectric and the thin region of the gate dielectric. The thick region of the gate dielectric and the thin region of the gate dielectric provide the transistor with an asymmetric threshold voltage.

4 Claims, 8 Drawing Sheets

US 8,557,624 B2

PIXEL SENSOR CELLS WITH A SPLIT-DIELECTRIC TRANSFER GATE

BACKGROUND

The invention relates generally to semiconductor device fabrication and, in particular, to pixel sensor cells and methods of fabricating pixel sensor cells, as well as design structures for a pixel sensor cell.

Digital cameras and optical imaging devices, such as web cameras and cell phone cameras, may employ (CMOS) pixel sensor cells to convert a visual image to digital data that may be represented by a picture. Each pixel sensor cell includes multiple photodiodes each masked by an optical filter with a different passband representing a range of wavelengths transmitted with minimal attenuation. Each photodiode converts the incident light into charge carriers that are collected in a charge collection well. Periodically, charge is transferred from the charge collection well to a floating diffusion region and stored. During a read out, a read circuit detects the amount of stored charge and converts the charge to an output voltage from the pixel sensor cell.

Improved pixel sensor cells and fabrication methods for pixel sensor cells, as well as design structures for pixel sensor cells, are needed.

BRIEF SUMMARY

In an embodiment of the invention, a method is provided for fabricating a pixel sensor cell. The method includes forming a gate dielectric with a thick region and a thin region and forming a gate electrode on the thick region of the gate dielectric and the thin region of the gate dielectric. The gate dielectric and the gate electrode collectively define a gate structure of the pixel sensor cell. The thick region of the gate dielectric and the thin region of the gate dielectric provide the gate structure with an asymmetric threshold voltage.

In an embodiment of the invention, a pixel sensor cell includes a photosensing element, a floating diffusion region and a gate structure configured to control carrier transfer from the photosensing element to the floating diffusion region. The gate structure includes a gate electrode and a gate dielectric. The gate dielectric includes a thick region and a thin region that provide the gate structure with an asymmetric threshold voltage.

In another embodiment, a hardware description language (HDL) design structure is encoded on a machine-readable data storage medium. The HDL design structure comprises elements that, when processed in a computer-aided design system, generates a machine-executable representation of a pixel sensor cell. The HDL design structure comprises a photosensing element, a floating diffusion region, and a gate structure configured to control carrier transfer from the photosensing element to the floating diffusion region. The gate structure includes a gate electrode and a gate dielectric. The gate dielectric includes a thick region and a thin region that provide the gate structure with an asymmetric threshold voltage. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention are generally directed to a pixel sensor cell that includes a transfer gate with a gate structure characterized by an asymmetric threshold voltage, $V_T$. The asymmetric threshold voltage is produced by forming a gate dielectric having a plurality of thicknesses (e.g., thin and thick regions). The dual dielectric thickness for the gate structure promotes the ability to modulate the threshold voltage across the transfer gate. The portion of the gate structure with the thicker gate dielectric has a higher threshold voltage and is located adjacent to the photosensitive region (e.g., a pinned photodiode) of the pixel sensor cell. The portion of the gate structure with the thinner gate dielectric has a lower threshold voltage and is adjacent to the floating diffusion region of the pixel sensor cell. The modulation of the threshold voltage optimizes the channel potential with a built-in electric field to sweep electrons toward the floating diffusion and to avoid spillback.

Figure 1:
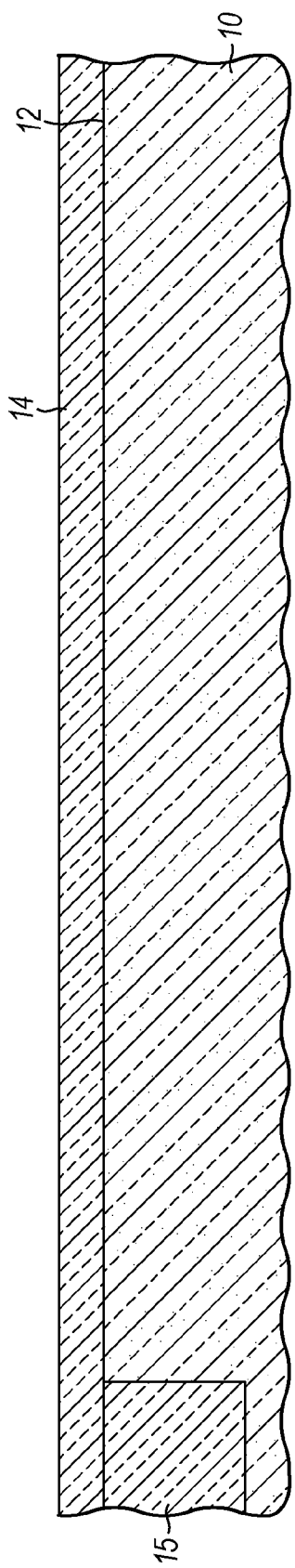
FIGS. 1-6 are cross-sectional views of a portion of a substrate at successive fabrication stages of a processing method for fabricating a pixel sensor cell in accordance with an embodiment of the invention.

With reference to FIG. 1 and in accordance with an embodiment of the invention, a semiconductor layer 10 is comprised of a semiconductor material that a person having ordinary skill in the art would recognize as suitable for forming an integrated circuit. For example, the semiconductor layer 10 may be comprised of a monocrystalline silicon-containing material, such as bulk single crystal silicon or a silicon-on-insulator (SOI) layer. The semiconductor material constituting semiconductor layer 10 may be lightly doped with an impurity to alter its electrical properties. Specifically, the semiconductor layer 10 may be lightly doped with a concentration of an n-type impurity species (e.g., arsenic) to render it initially lightly doped n-type ($n^-$) semiconductor material or lightly doped with a concentration of a p-type impurity species (e.g., boron or indium) to render it initially lightly doped p-type ($p^-$) semiconductor material. The semiconductor layer 10 may be an epitaxial layer grown on a bulk substrate of higher doping (e.g., $p^+$) and the light-doping state of semiconductor layer 10 may result from doping during epitaxial growth.

An isolation structure 15 may be formed in the semiconductor layer 10 by a shallow trench isolation (STI) technique that relies on conventional lithography and dry etching processes to define trenches in semiconductor layer 10, fills the trenches with portions of a dielectric material, and planarizes the dielectric material to the top surface 12 of semiconductor layer 10 using a chemical mechanical polishing (CMP) process. The dielectric material contained in isolation structure 15 may be an oxide, such as densified tetraethylorthosilicate (TEOS) deposited by thermal chemical vapor deposition (CVD) or a high-density plasma (HDP) oxide deposited with plasma assistance. The isolation structure 15, which is formed proximate to the invented location of the pixel sensor cell, functions to isolate the cell from adjacent pixel sensor cells of similar construction.

A dielectric layer 14 is formed on a top surface 12 of the semiconductor layer 10. The dielectric layer 14 will contribute to formation of gate dielectrics for the transfer and reset transistors. The dielectric layer 14 may have a physical layer thickness ranging from 1 nm to 15 nm and may be comprised of any suitable dielectric material including, but not limited to, an oxide of silicon such as silicon dioxide ($SiO_2$). In a representative embodiment, the dielectric layer 14 may be $SiO_2$ grown by wet or dry thermal oxidation of a surface layer of the semiconductor layer 10 or $SiO_2$ deposited by, for example, CVD or atomic layer deposition (ALD).

Figure 2:
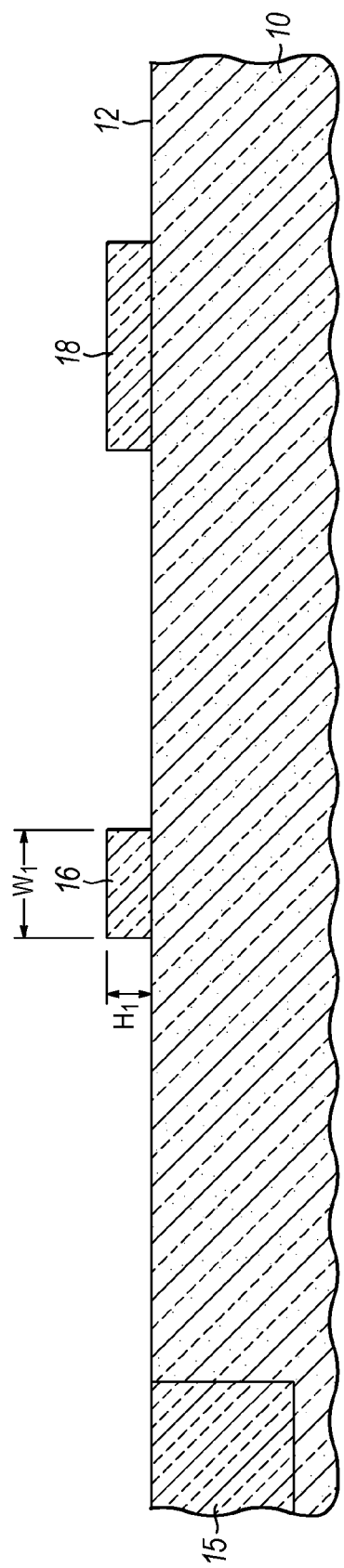

With reference to FIG. 2 in which like reference numerals refer to like features in FIG. 1 and at a subsequent fabrication stage, the dielectric layer 14 is patterned with a lithography and etching process to form dielectric islands 16, 18 of dielectric material at the intended locations for the gate structures of the transfer and reset transistors. In particular, dielectric island 16 is formed with a given set of dimensions, including a height, $H_1$, referenced to the top surface 12 of the semiconductor layer 10, a width, $W_1$, and a length (not shown).

To form dielectric islands 16, 18, a resist (not shown) is applied on a top surface of the dielectric layer 14 by a spin coating process, pre-baked, exposed to a radiation projected through a photomask, baked after exposure, and developed with a chemical developer to form a mask that includes islands coinciding spatially with the intended locations of dielectric islands 16, 18. The pattern is transferred from the mask to the dielectric layer 14 with a wet etching process or a dry etching process, such as a reactive-ion etching (RIE) or a plasma etching process. Dielectric material in dielectric layer 14 that is unprotected by the mask islands is removed by the etching process to define the dielectric islands 16, 18. The etching process relies on an etchant chemistry that removes the dielectric material of the dielectric layer 14 selective to (i.e., at a higher etch rate than) the material constituting the semiconductor layer 10 and preferably stops on the top surface 12 of the semiconductor layer 10. The resist is removed by ashing or solvent stripping and a conventional cleaning process is applied.

Figure 3:
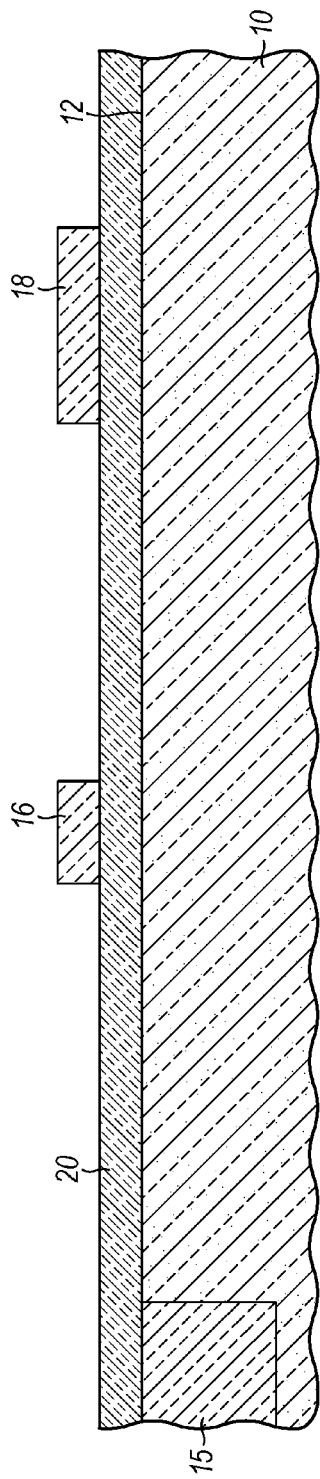

With reference to FIG. 3 in which like reference numerals refer to like features in FIG. 2 and at a subsequent fabrication stage, a dielectric layer 20 is formed on the top surface 12 of the semiconductor layer 10. The dielectric layer 20 may have a layer thickness ranging from 1 nm to 15 nm. The material of dielectric layer 20 may be comprised of any suitable dielectric material including, but not limited to, an oxide of silicon such as $SiO_2$.

In a representative embodiment, the dielectric layer 20 may be $SiO_2$ grown by wet or dry thermal oxidation of a thin surface layer of the semiconductor layer 10, which consumes the thin surface layer. The oxidizing species diffuses through the dielectric islands 16, 18 to the top surface 12 of the semiconductor layer 10 and oxidizes the semiconductor material of semiconductor layer 10 across a surface area located beneath the dielectric islands 16, 18. In this embodiment, the dielectric layer 20 and the dielectric islands 16, 18 may have an integral, one-piece structure in which distinct layering is absent. In other words, the dielectric layer 20 is not a distinct additive layer applied to the dielectric islands 16, 18 but, instead, may be formed as a continuous structure that lacks a distinguishable boundary interface.

Figure 4:
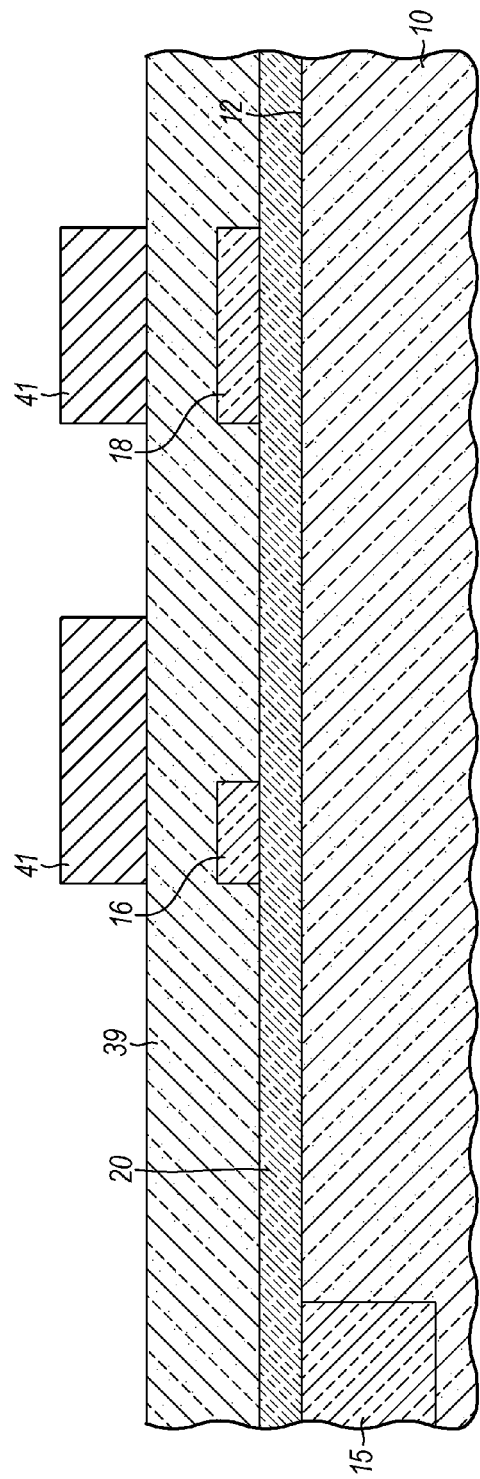
Figure 5:
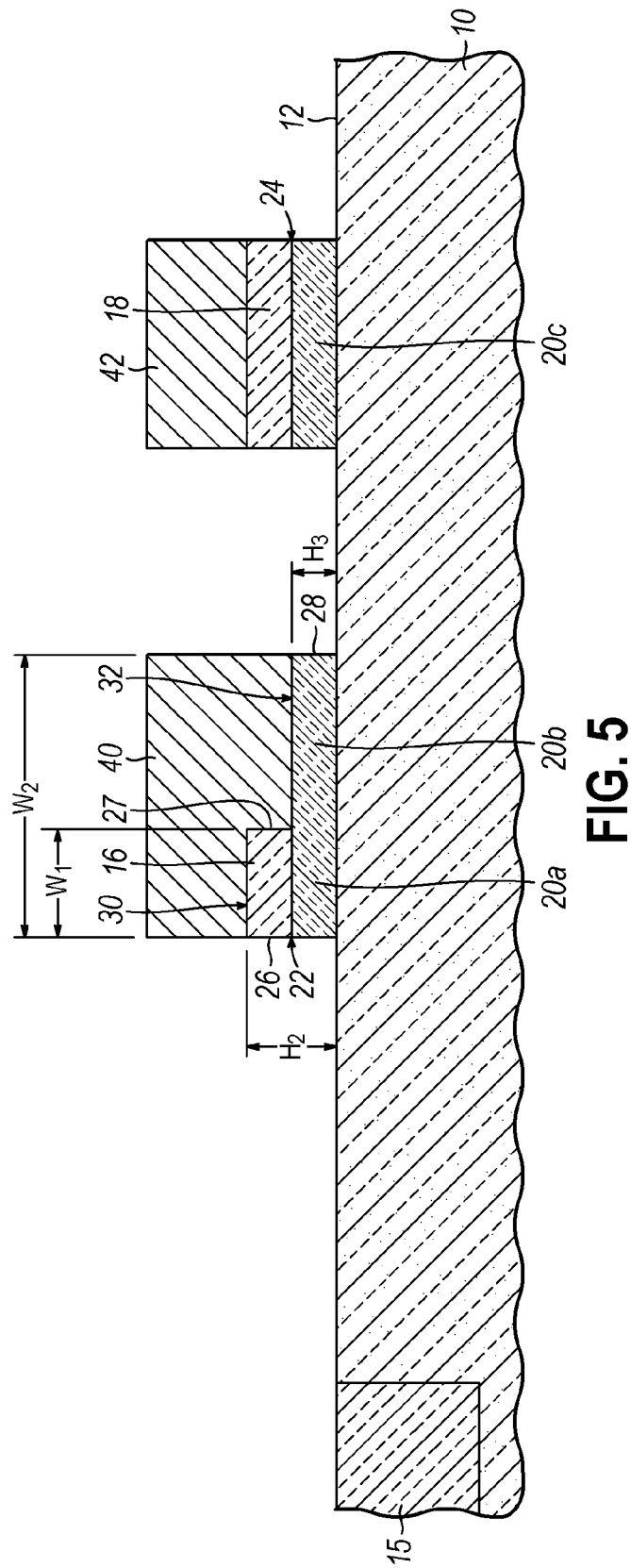
Figure 5A:
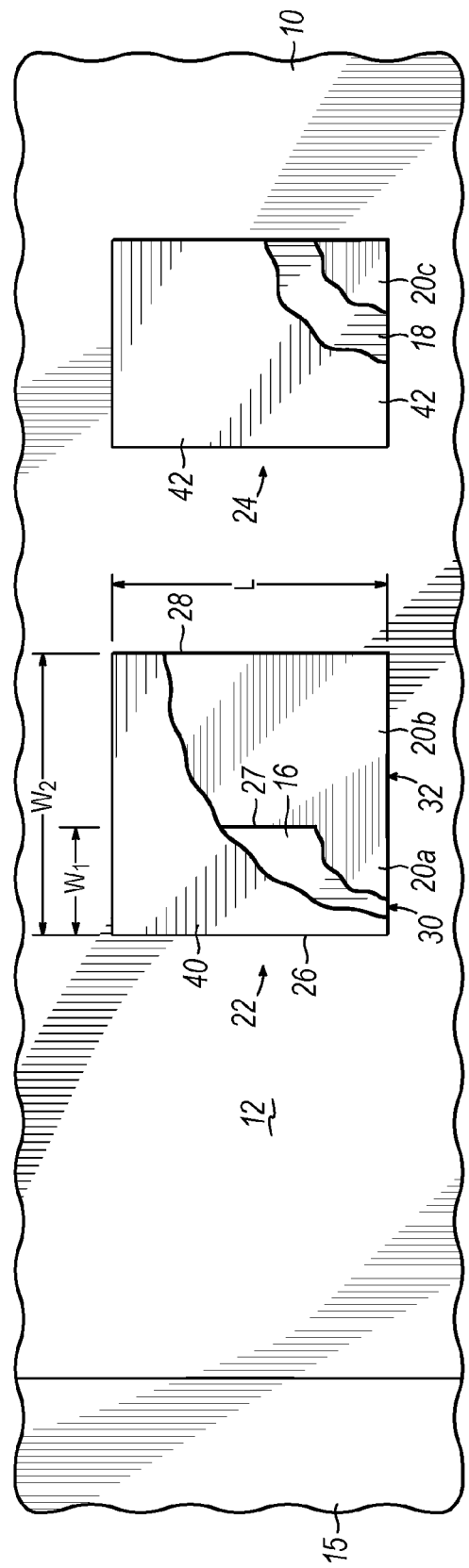
FIG. 5A is a top view of the substrate portion at the fabrication stage of FIG. 5.

With reference to FIG. 4 in which like reference numerals refer to like features in FIG. 3 and at a subsequent fabrication stage, a blanket layer 39 comprised of a conductor is deposited on the top surfaces of the dielectric layer 20 and dielectric islands 16, 18. The conductor in the blanket layer 39 is characterized by a significantly higher electrical conductivity than the materials of the dielectric layer 20 and dielectric islands 16, 18. In a representative embodiment, the conductor comprising the blanket layer 39 may be polysilicon deposited by CVD using either silane or disilane as a silicon source and either doped in situ during deposition or doped post-deposition. Alternatively, the conductor may be any material or combination of materials recognized by a person having ordinary skill in the art as suitable to form gate electrodes 40, 42 (FIGS. 5, 5A). For example, the blanket layer 39 may include a metal, a metal nitride, a metal silicide, or a layered stack of these conductive materials with each other or with polysilicon.

An etch mask 41 is applied on a top surface of the blanket layer 39 and patterned to provide islands of sacrificial material at the intended locations for gate structures of the transfer transistor 60 and the reset transistor 62 (FIGS. 5, 5A). The etch mask 41 may be comprised of an organic resist that is applied by spin coating, pre-baked, exposed to a radiation projected through a photomask, baked following exposure, and developed with a chemical developer. The dimensions of the islands of sacrificial material in the etch mask 41 function to determine the dimensions (e.g., length and width) of the gate structures for the transfer transistor 60 and the reset transistor 62.

With reference to FIGS. 5 and 5A in which like reference numerals refer to like features in FIG. 4 and at a subsequent fabrication stage, the gate structures for the transfer transistor 60 and reset transistor 62 are formed by a lithography and etching process. The gate structure for the transfer transistor 60 includes a gate dielectric 22 and the gate electrode 40. The gate structure for the transfer transistor 60 overlies a planar channel region 44 and the gate electrode 40 is electrically connected with one or more contacts (not shown). The gate structure for the reset transistor 62 includes a gate dielectric 24 and the gate electrode 42 also electrically connected with one or more contacts (not shown).

An anisotropic etching process, such as RIE, is used to remove portions of the blanket conductor layer 39 and the dielectric layer 20 that are not protected by the islands of sacrificial material in the mask 41. The etching process relies on an etchant chemistry that removes the unmasked material of the blanket conductor layer 39 and stops on a top surface of the dielectric layer 20. The etchant chemistry is changed so that the etching process removes the unmasked material of the dielectric layer 20 and stops on the top surface 12 of the semiconductor layer 10. The islands of sacrificial material in the mask 41 are positioned laterally relative to the top surface 12 of semiconductor layer 10 in vertical registration with the gate structures of the transfer transistor 60 and the reset transistor 62. The etch mask 41 is stripped to expose the gate structures and a conventional cleaning process is applied.

The gate dielectric 22 for the transfer transistor includes a layer stack that features the dielectric island 16 and adjacent portions 20a, 20b of the patterned dielectric layer 20. The upper layer in the layer stack consists of the dielectric island 16, which has width, $W_1$. The base of the gate dielectric 22 consists of the portions 20a, 20b of the dielectric layer 20 and is characterized by a width, $W_2$, that is greater than width, $W_1$, and a length, L, that may be equal to the original length of the dielectric island 16. Portions 20a, 20b of the dielectric layer 20 directly contact the top surface 12 of the semiconductor layer 10 and the dielectric island 16 directly contacts a top surface of portion 20a.

The dielectric material in the portion 20a of dielectric layer 20 and the dielectric island 16 collectively define a thick region 30 of the gate dielectric 22 for the transfer gate. The thick region 30 has a given set of dimensions, including a layer thickness given by a height, $H_2$, referenced to the top surface 12 of the semiconductor layer 10 and greater than height, $H_1$, (FIG. 2). The thick region 30 is characterized by the width, $W_1$, which is established by the original dimensions (length and width) of the dielectric island 16.

Portion 20b of the patterned dielectric layer 20 is outside of the footprint of the dielectric island 16 when viewed normal to the top surface 12. As a result, portion 20a constitutes the thin region 32 of the gate dielectric 22. The thin region 32 has a layer thickness given by a height, $H_3$, referenced to the top surface 12 of the semiconductor layer 10 and a width given by the difference between widths $W_1$ and $W_2$. The thin region 32 is appreciably thinner than the thick region 30 and, as a result, the gate dielectric 22 has a stepped appearance. The thick region 30 has a thickness that is increased, in comparison with the thickness of the dielectric island 16, by an amount commensurate with the thickness of the thin region 32. In one embodiment, the thick region 30 may have a layer thickness ranging from 2 nm to 30 nm due to the preexistence of the thinner dielectric island 16 and the thin region 32 may have a layer thickness ranging from 1 nm to 15 nm. As a result, the height difference between the regions 30, 32 may range from 1 nm to 15 nm. The thick and thin regions 30, 32 may be comprised of dielectric materials with the same relative permittivity or dielectric constant, but may have different thicknesses to provide an asymmetry in the thickness of the gate dielectric 22.

Portion 20a of the patterned dielectric layer 20 and the dielectric island 16 share a common sidewall 26. The dielectric island 16 has a sidewall 27 that is separated from sidewall 26 by the width, $W_1$, of the dielectric island 16. Portion 20a of the patterned dielectric layer 20 has a sidewall 28 that is separated from sidewall 26 by the width, $W_2$, of portions 20a, 20b.

The gate electrode 40 includes sidewalls 43, 45 that aligned with the sidewalls 26, 28 of the gate dielectric 22 in the layer stack defining the gate structure for the transfer transistor 60. The space overlying the thin region 32 of the gate dielectric 22 is occupied by a relatively thick region of the gate electrode 40, which directly contacts the thin region 32 of the gate dielectric 22. A relatively thin region of the gate electrode 40 overlies and directly contacts the thick region 30 of the gate dielectric 22. The gate dielectric 22 is interposed between the gate electrode 40 and the top surface 12 of the semiconductor layer 10 and, in particular, is interposed between the gate electrode 40 and the planar channel region 44 in the semiconductor layer 10 for the transfer transistor.

The gate dielectric 24 for the reset gate includes the dielectric island 18 and an overlying portion 20c of the patterned dielectric layer 20 arranged in a layer stack. The gate dielectric 24 has a uniform layer thickness across its length and width because the dimensions of the corresponding island in mask 41 are commensurate with the dimensions of the dielectric island 18 and overlying portion 20c of the dielectric layer 20. The gate electrode 42 is arranged in the stack above the gate dielectric 24 and is separated from another planar channel region in the substrate by the gate dielectric 24.

Figure 6:
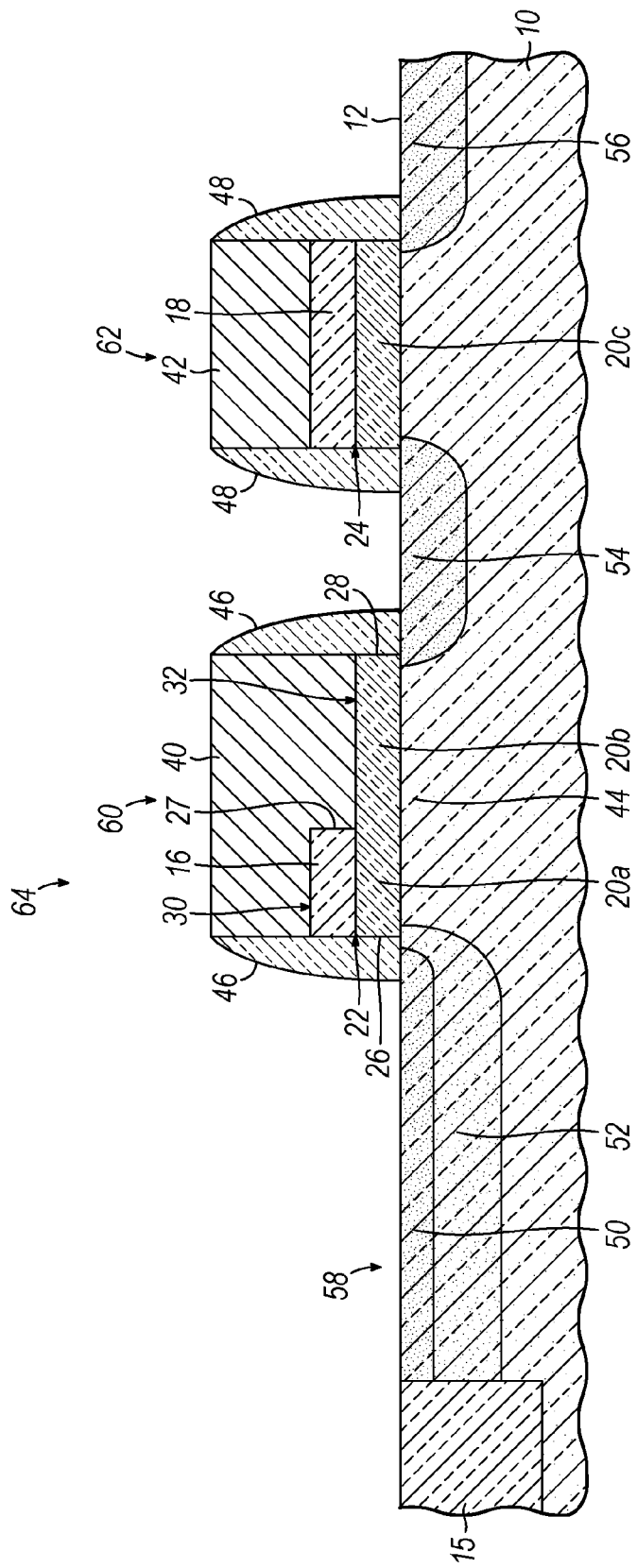

With reference to FIG. 6 in which like reference numerals refer to like features in FIG. 5 and at a subsequent fabrication stage, a pixel sensor cell 64 is completed by forming a charge collection well 52, a pinning layer 50 for the charge collection well 52, a floating diffusion region 54, and a contact region 56 in the semiconductor layer 10. The sidewall 26 of portion 20a of the patterned dielectric layer 20 and the dielectric island 16 is positioned proximate or adjacent to the charge collection well 52 and pinning layer 50. The sidewall 28 of portion 20a of the patterned dielectric layer 20 is positioned proximate or adjacent to the floating diffusion region 54.

Sidewall spacers 46, 48 may be formed on the gate electrodes 40, 42 by a conventional spacer formation process. The sidewall spacers 46, 48 may be formed by depositing a conformal layer of an electrically insulating material, such as about ten (10) nanometers to about fifty (50) nanometers of $Si_3N_4$ deposited by CVD, and anisotropic etching the conformal layer to preferentially remove the electrically insulating material from horizontal surfaces. The electrical conductivity of dielectric material in the sidewall spacers 46, 48 is substantially less than the electrical conductivity of the conductor in the gate electrodes 40, 42. In certain embodiments of the invention, the sidewall spacers 46, 48 may be omitted.

The pinning layer 50 is disposed vertically between the charge collection well 52 and the top surface 12 of the semiconductor layer 10 and laterally between the planar channel region 44 and the isolation structure 15. The charge collection well 52, which is aligned with the pinning layer 50, is spaced from the top surface 12 by the intervening pinning layer 50. The floating diffusion region 54 is separated laterally from the charge collection well 52 by the channel region 44 of the gate structure for the transfer transistor 60 and is suitably close to the top surface 12 for establishing electrical connection with one or more contacts (not shown).

The charge collection well 52 of pixel sensor cell 64 has an opposite conductivity type to the semiconductor layer 10. The charge collection well 52 serves as a source for the transfer transistor 60. The charge collection well 52 is formed using an implantation mask and an ion implantation process to introduce a suitable impurity species as a dopant into the semiconductor layer 10 at a location adjacent to the gate electrode 40 of the gate structure for the transfer transistor 60. The implantation mask may be formed by applying a photoresist layer with a spin coating process, exposing the photoresist to radiation imaged through a photomask, and developing the exposed photoresist to provide a window at the intended location in semiconductor layer 10 for the charge collection well 52. The edge of the window coincides with the edge of the sidewall spacer 46 or, if the sidewall spacer 46 is omitted, the window edge coincides with the sidewall 26 of the gate electrode 40.

A conventional implantation process is used to generate and implant energetic ions of the impurity species. The charge collection well 52 may be formed with multiple implantations at different kinetic energies that collectively provide a doped region in the semiconductor material of semiconductor layer 10 characterized by an appropriate dopant concentration and dopant depth distribution. The doses and projected ranges of the impurity species are selected to supply a dopant concentration suitable for the photodiode region, such as a light dopant concentration. The thickness of the ion implantation mask is selected to stop the energetic ions outside of the window in the mask. The conductivity type of the dopant used to form the photodiode region is opposite to the conductivity type of the dopant used to form the photodiode pinning layer. In one embodiment, the impurity species is an element from Group V of the Periodic Table (e.g., phosphorus, arsenic or antimony) effective to act as a dopant to impart an n-type conductivity in the semiconductor material of the semiconductor layer 10.

The pinning layer 50 of pixel sensor cell 64 has the same conductivity type as the semiconductor layer 10 but a higher dopant concentration and an opposite conductivity type than the charge collection well 52. The pinning layer 50 may be formed using an ion implantation mask and an ion implantation process to introduce a suitable impurity species as a dopant into the semiconductor layer 10. The same implantation mask used to form the charge collection well 52 may be used to form the pinning layer 50 or, alternatively, a new implantation mask may be applied. Energetic ions of the impurity species are generated and implanted using a conventional implantation process. The ion kinetic energy is selected such that the projected range of the ions is at a relatively shallow depth beneath the top surface 12 of the semiconductor layer 10 and between the charge collection well 52 and the top surface 12. The thickness of the ion implantation mask is selected to stop the energetic ions outside of the window in the mask. In one embodiment, the impurity species is an element in Group III of the Periodic Table (e.g., boron or indium) effective to act as a dopant to impart a p-type conductivity in the semiconductor material of the semiconductor layer 10. The dose of the impurity species is selected to supply a dopant concentration suitable for the pinning layer 50, such as a moderate dopant concentration, and higher than the concentration in the semiconductor layer 10.

The floating diffusion region 54 and a contact region 56 of pixel sensor cell 64 have an opposite conductivity type to the semiconductor layer 10 and the same conductivity type as the charge collection well 52. The floating diffusion region 54 and contact region 56 are located on opposite sides of the gate electrode 42 for the reset transistor 62 and may be formed using an ion implantation mask and an ion implantation process to introduce a suitable impurity species as a dopant into the semiconductor layer 10. The floating diffusion region 54 serves as a drain for the transfer transistor 60 and as a source for the reset transistor 62. An implantation mask is prepared as described above for the implantation mask used to form the charge collection well 52. However, the implantation mask has windows that coincide with the intended locations for the floating diffusion region 54 and contact region 56. Energetic ions of the impurity species are generated and implanted using a conventional implantation process. The ion kinetic energy is selected such that the projected range of the ions is at a relatively shallow depth beneath the top surface 12 of the semiconductor layer 10. The thickness of the ion implantation mask is selected to stop the energetic ions outside of the window in the mask. In one embodiment, the impurity species in the ions is an element in Group V of the Periodic Table (e.g., phosphorus, arsenic, or antimony) effective to act as a dopant to impart n-type conductivity in the semiconductor material of the semiconductor layer 10. The dose of the impurity species is selected to supply a dopant concentration suitable for a contacted source and drain of an FET device.

One or more high-temperature anneals may be required to electrically activate the various implanted impurity species, to alleviate implantation damage, and to re-distribute the impurity species within the doped regions. Alternatively, the doped regions may be formed by dopant diffusion inward from the top surface 12 of the semiconductor layer 10.

The charge collection well 52 and the nearby region of the semiconductor layer 10, which is oppositely-doped, collectively constitute a photosensing element in the representative form of a pinned photodiode 58. Electron-hole pairs are generated as photocarriers within a depletion region of the photodiode 58 when impinged by incident light, which is typically filtered with a color filter and focused onto the photosensing element by a lens. The number of generated electron-hole pairs is proportional to the number of photons. Photocarriers of one charge type, either electrons or holes, are accumulated and stored in the charge collection well 52. The photodiode 58 of pixel sensor cell 64 is "pinned" because the potential in the photodiode 58 is pinned to a constant value when the photodiode 58 is fully depleted. It should be understood, however, that the pixel sensor cell 64 may include a photogate, a photoconductor, or another type of photon-to-charge converting device, as a substitute for the pinned photodiode 58.

When voltage is applied to the gate electrode 40, the stored photocarriers are transferred from the charge collection well 52 through the channel region 44 to the floating diffusion region 54 of pixel sensor cell 64. The floating diffusion region 54 may be covered by an opaque light shield (not shown) to block light exposure. The floating diffusion region 54 stores the photocarriers as electrical charge as data until a read circuit detects the amount of stored charge and converts the charge to a pixel output voltage. The reset transistor 62 is used to set the floating diffusion region 54 to a known state before charge is transferred from the charge collection well 52 to the floating diffusion region 54.

The gate dielectric 22 provides the transfer transistor 60 with an asymmetric threshold voltage in which the portion of the transfer transistor 60 on the source side (i.e., the side nearest to the charge collection well 52 and including the thick region 30 of the gate dielectric 22) has a higher threshold voltage and the portion of the transfer transistor 60 on the drain side (i.e., the side more distant from the charge collection well 52 and including the thin region 32 of the gate dielectric 22) has a lower threshold voltage. The threshold voltage asymmetry improves the efficiency of the transfer transistor 60 because charge can be transferred from the charge collection well 52 to the floating diffusion region 54 without spilling back some fraction of the charge into the charge collection well 52 when the gate electrode 40 is turned off. The improved efficiency reduces lag and noise for the pixel sensor cell 64 in successive image frames.

In an alternative embodiment of the present invention, a replacement gate process is used that relies on a "dummy" gate of a sacrificial material for forming the implanted regions of the pixel sensor cell 64. In this instance, dummy gates are formed on the surface of semiconductor layer 10 at the intended location for the gate structure including gate dielectric 22 and gate electrode 40 and at the intended location for the gate structure including gate dielectric 24 and gate electrode 42. The dummy gates are formed before the implantations creating the charge collection well 52, pinning layer 50, floating diffusion region 54, and contact region 56 of pixel sensor cell 64 are executed as described above. Following formation of the implanted regions, the dummy gates are removed with an etching process. The gate electrodes 40, 42 and gate dielectrics 22, 24 are formed, as described above, at the respective intended locations formerly occupied by the dummy gates. The final structure may have approximately the same appearance as in FIG. 6.

Embodiments of the invention are described herein below in terms of a "pixel sensor cell". It is noted that the term "pixel sensor cell" is used to generally refer to any type of sensor cell that is capable of converting incident electromagnetic radiation into an electrical signal. An example of a pixel sensor cell according to the invention includes a pixel sensor cell that is capable of detecting optical wavelengths of electromagnetic radiation and is commonly referred to as an "image sensor". An image sensor fabricated using CMOS technology is commonly referred to as a "CMOS image sensor".

The configuration of the transfer transistor 60 of pixel sensor cell 64 is stable when exposed to thermal budgets employed during the process flow for the pixel sensor cell 64 subsequent to the formation of the gate dielectric 22. The gate dielectric 22 of multiple thicknesses (e.g., thin and thick regions), which imparts the asymmetric threshold voltage, $V_T$, to the transfer transistor 60 are not susceptible to change with thermal budget, which represents a total amount of thermal energy transferred to the pixel sensor cell 64 during elevated temperature processes.

Figure 7:
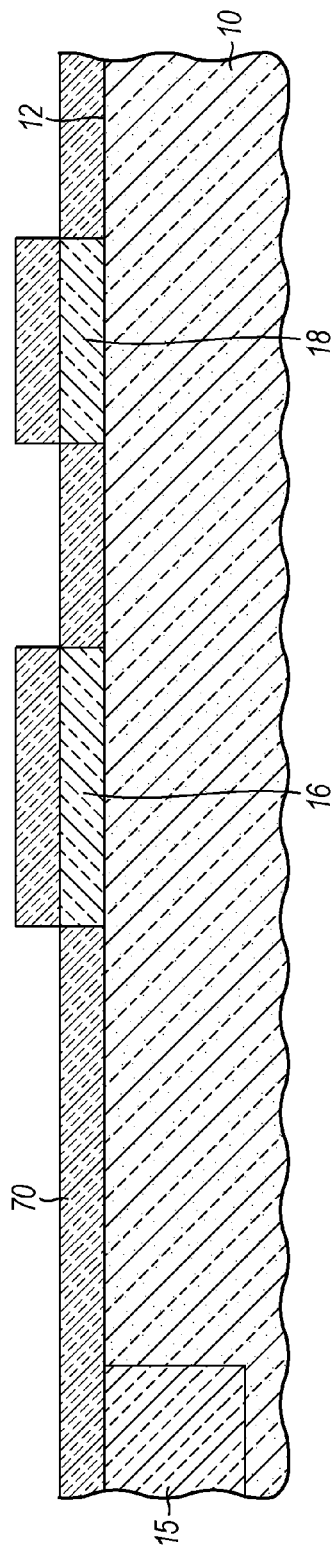
FIG. 7 is a cross-sectional view of the substrate portion of FIG. 2 at a subsequent fabrication stage of a processing method for fabricating a pixel sensor cell in accordance with an alternative embodiment of the invention.

With reference to FIG. 7 in which like reference numerals refer to like features in FIG. 2 and at a subsequent fabrication stage in accordance with an alternative embodiment, a conformal layer 70 of a dielectric material is deposited on a top surface 12 of the semiconductor layer 10 and across the dielectric islands 16, 18. When dielectric layer 14 is etched to form the dielectric islands 16, 18 (FIG. 2), the length and/or width of the dielectric island 16 may be adjusted to be, for example, slightly larger as shown in FIG. 7. The dielectric layer 70 may be comprised of a high dielectric constant (high-k) dielectric material characterized by a relatively high dielectric constant (e.g., permittivity) and may have a layer thickness ranging from 1 nm to 10 nm. As used herein, candidate high-k dielectrics are considered to have a dielectric constant greater than 10 and, preferably, in a range of 10 to 100. Air, which is an accepted reference point for values of relative permittivity or dielectric constant, has a dielectric constant of approximately unity. Representative dielectric materials for dielectric layer 70 include, but are not limited to, hafnium-based dielectric materials like hafnium oxide ($HfO_2$), hafnium silicate (HfSiO), or a nitrided hafnium silicate (HfSiON), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. These types of high-k dielectric materials may be deposited by ALD, CVD, or another conventional deposition technique. Use of a high-k dielectric in a transistor gate structure has been observed to significantly reduce leakage currents, which reduces power consumption for the transistor.

In an alternative embodiment, the dielectric constant of the dielectric island 16 may be less than 10. In another embodiment, the dielectric constant of the dielectric island 16 may be approximately equal to 3.9 if the dielectric island 16 is comprised of silicon dioxide.

Figure 8:
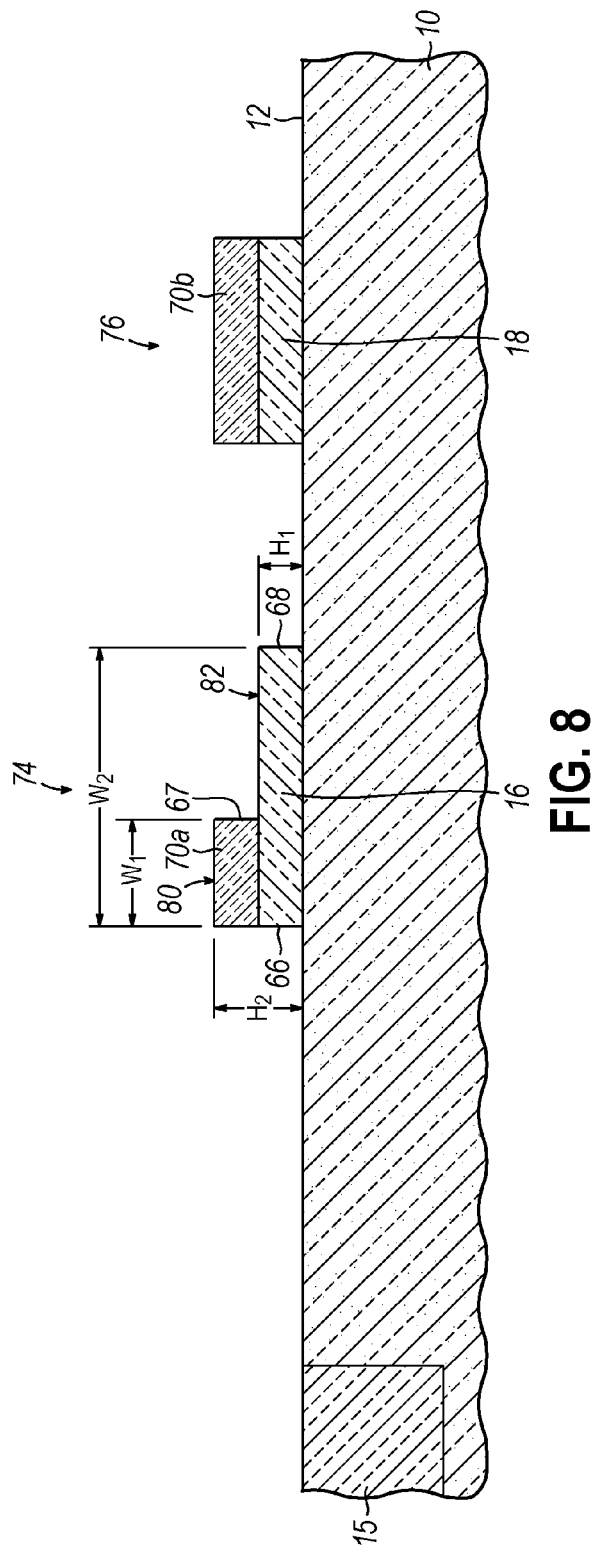
FIGS. 8 and 9 are cross-sectional views of the substrate portion of FIG. 7 at subsequent fabrication stages.

With reference to FIG. 8 in which like reference numerals refer to like features in FIG. 7 and at a subsequent fabrication stage, a gate dielectric 74 for the transfer transistor 60 and a gate dielectric 76 for the reset transistor 62 are formed from the dielectric layer 70 with a lithography and etching process. To that end, an etch mask (not shown) is applied on a top surface of the dielectric layer 70. The etch mask may be resist applied by a spin coating process, pre-baked, exposed to a radiation projected through a photomask, baked after exposure, and developed with a chemical developer. The etch mask includes islands of sacrificial material at the intended locations of the gate dielectrics 74, 76. In particular, the island of sacrificial material on dielectric island 16 has a size and shape that is smaller dimensionally in length and width than the dielectric island 16.

An etching process, such as RIE, removes portions of the dielectric layer 70 that are not protected by the islands of sacrificial material in the etch mask. The etching process relies on an etchant chemistry that removes the dielectric material of the dielectric layer 70 selective to (i.e., at a higher etch rate than) the material constituting the semiconductor layer 10 and preferably stops on the top surface 12 of the semiconductor layer 10. The etching process is also selective to the dielectric material forming the dielectric island 16. The etch mask is stripped to completely expose the gate dielectrics 74, 76 and a conventional cleaning process is applied.

The gate dielectric 74 for the gate structure of the transfer transistor 60 is comprised of the dielectric island 16 and a residual portion 70a of the patterned dielectric layer 70 that resides on a top surface of the dielectric island 16. The base of the gate dielectric 74, which consists of the dielectric island 16, is characterized by a height, $H_1$, a width, $W_2$, and a length, L.

Portion 70a of the patterned dielectric layer 70 overlies and directly contacts a top surface of the dielectric island 16 to define a thick region 80 of the gate dielectric 74 for the transfer transistor. The thick region 80 has a given set of dimensions, including a layer thickness given by a height, $H_2$, referenced to the top surface 12 of the semiconductor layer 10. The thick region 80, which consists of the dielectric island 16 and portion 70a, is characterized by a width, $W_1$. Thick region 80 has an effective or composite dielectric constant given by a linear combination of the individual dielectric constants of the dielectric materials of dielectric island 16 and the portion 70a of dielectric layer 70 in proportion to the relative thicknesses. As a result, the thick region 80 has a different dielectric constant than the thin region 82 comprised of a single dielectric material. In particular, the dielectric constant of the thick region 80 is higher than the dielectric constant of the thin region 82 because thick region 80 includes the portion 70a of high-k dielectric material and an equal thickness of the dielectric material of dielectric island 16, which has a lower dielectric constant than portion 70a.

A thin region 82 of the gate dielectric 74 directly contacts the top surface 12 of the semiconductor layer 10. The thin region 82 has a layer thickness given by a height, $H_1$, referenced to the top surface 12 of the semiconductor layer 10, and thinner than height, $H_2$. The thin region 82 is appreciably thinner than the thick region 80 and, as a result, the gate dielectric 74 has a stepped appearance. The thick region 80 may be approximately twice the thickness of the thin region 82. In one embodiment, the thick region 80 may have a layer thickness ranging from 2 nm to 25 nm due to the preexistence of the thinner dielectric island 16 and the thin region 82 may have a layer thickness ranging from 1 nm to 15 nm. As a result, the height difference between the regions 80, 82 may range from 1 nm to 14 nm.

Gate dielectric 76 for the gate structure of the reset transistor 62a is concurrently formed from the dielectric island 18 and an overlying portion 70b of the patterned dielectric layer 70 at the location of dielectric island 18. The gate dielectric 76 has a uniform layer thickness across its length and width because the dimensions of the corresponding island of resist are commensurate with the dimensions of the thickened dielectric island 18.

Figure 9:
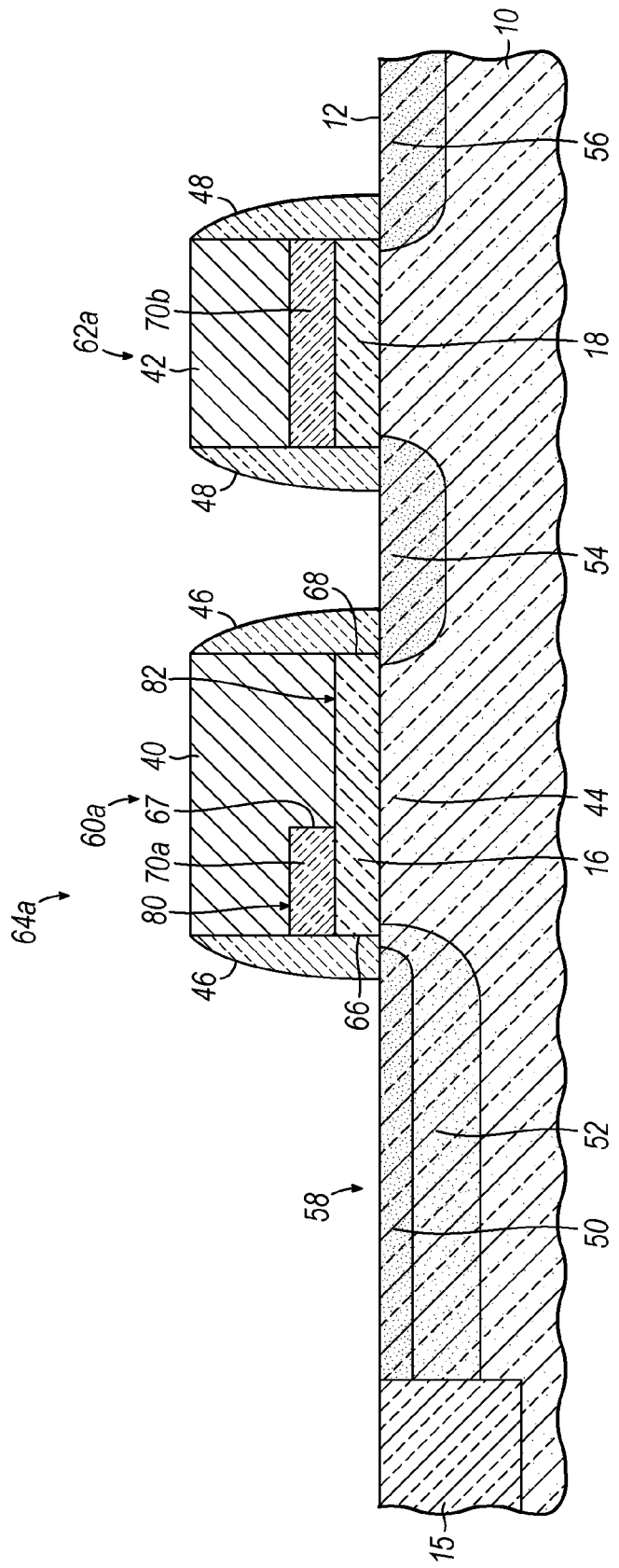

With reference to FIG. 9 in which like reference numerals refer to like features in FIG. 8 and at a subsequent fabrication stage, the remainder of a pixel sensor cell 64a is fabricated as described above in connection with FIGS. 4-6 to produce the final device structure of FIG. 9 that includes the gate electrodes 40, 42, the optional sidewall spacers 46, 48, the charge collection well 52, the pinning layer 50 for the charge collection well 52, the floating diffusion region 54, and the contact region 56 in the semiconductor layer 10. The gate electrode 40 and the gate dielectric 74 collectively define a gate structure of the transfer transistor 60a. The gate electrode 42 and the gate dielectric 76 collectively define a gate structure of the reset transistor 62a.

The gate electrodes 40, 42 are formed from the conductor layer 39 using mask 41 after the gate dielectrics 74, 76 are defined. The process for forming the gate electrodes 40, 42 is described above in connection with FIGS. 4 and 5. In this embodiment, dielectric layer 70 is patterned and the gate dielectrics 74, 76 are dimensionally defined before the gate electrodes 40, 42 are formed.

Portion 70a of the patterned dielectric layer 70 and the dielectric island 16 share a sidewall 66 that is proximate or adjacent to the charge collection well 52 and pinning layer 50. Portion 70a of the patterned dielectric layer 70 has a sidewall 67 that is separated from sidewall 66 by the width, $W_1$, of the portion 70a. The dielectric island 16 has a sidewall 68 that is separated from sidewall 66 by the width, $W_2$, of dielectric island 16. The sidewall 43 of gate electrode 40 is vertically aligned with sidewall 66 and the opposite sidewall 45 of gate electrode 40 is aligned with sidewall 68.

The gate dielectric 74 (FIG. 8) provides the transfer transistor 60 with an asymmetric threshold voltage in which the portion of the transfer transistor 60 on the source side (i.e., the side nearest to the charge collection well 52 and including the thick region 80 of the gate dielectric 74) has a higher threshold voltage and the portion of the transfer transistor 60 on the drain side (i.e., the side more distant from the charge collection well 52 and including the thin region 82 of the gate dielectric 74) has a lower threshold voltage.

Figure 10:
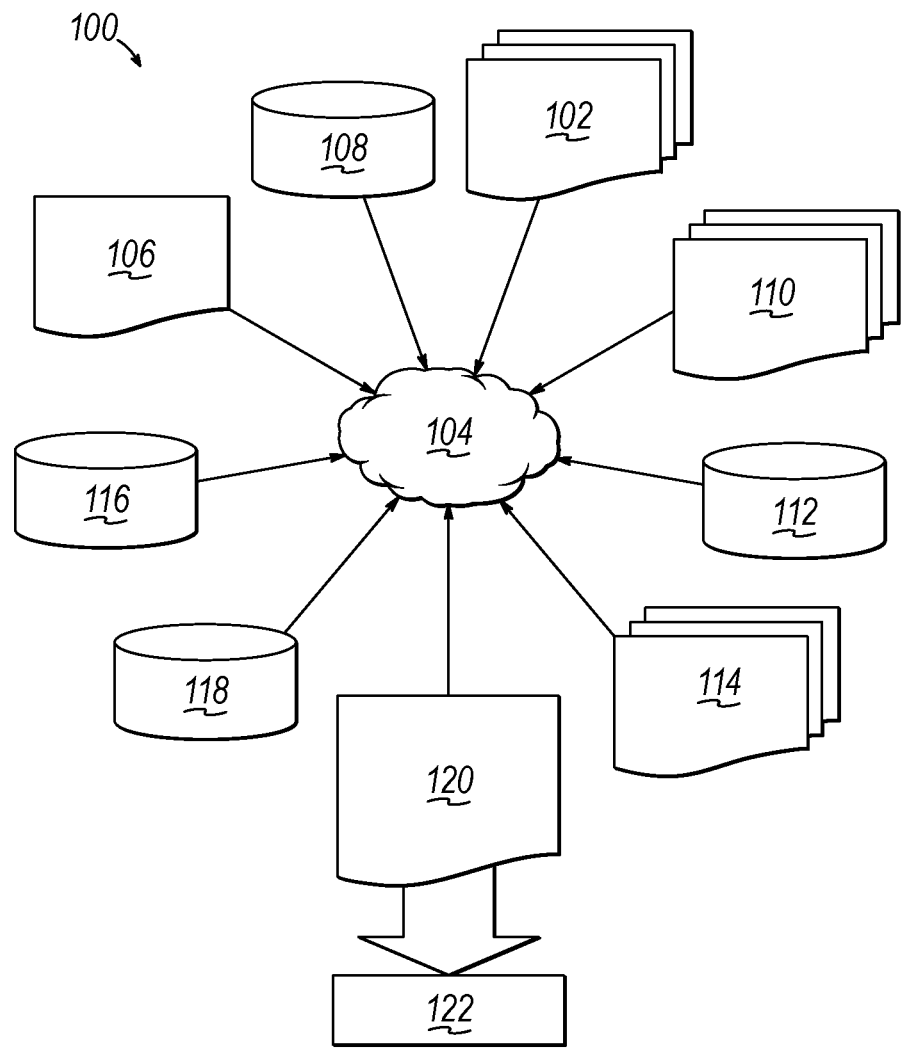
FIG. 10 is a flow diagram of a design process used in semiconductor design, manufacture, and/or test.

FIG. 10 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 6 and 9. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6 and 9. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 6 and 9 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6 and 9. In one embodiment, design structure 120 may comprise a compiled, executable HDL simulation model that functionally simulates the devices shown in FIGS. 6 and 9.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6 and 9. Design structure 120 may then proceed to a stage 122 where, for example, design structure 120: proceeds to tape-out, is released to manufacturing, is released to a mask house, is sent to another design house, is sent back to the customer, etc.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for fabricating a pixel sensor cell, the method comprising:
    forming a first gate dielectric with a thick region and a thin region on a top surface of a semiconductor layer;
    when forming the first gate dielectric, forming a second gate dielectric including a first layer and a second layer on the top surface of the semiconductor layer;
    concurrently forming a first gate electrode on the first gate dielectric and a second gate electrode on the second gate dielectric to respectively define a transfer gate structure and a reset gate structure; and
    forming a floating diffusion region in the semiconductor layer laterally located between the transfer gate structure and the reset gate structure,
    wherein the thick region of the first gate dielectric is laterally positioned between the photosensing element and the thin region of the gate dielectric, the thin and thick regions of the first gate dielectric and the first layer of the second gate dielectric include respective portions of a silicon dioxide layer, and the second layer of the second gate dielectric and the thick region of the first gate dielectric include respective portions of a high-k dielectric layer disposed on the portions of the silicon dioxide layer.

2. The method of claim 1 further comprising:
    forming a photosensing element in the semiconductor layer laterally separated from the floating diffusion region by a channel in the semiconductor layer beneath the transfer gate structure.

3. The method of claim 2 wherein forming the photosensing element further comprises:
    forming a charge collection region of a pinned photodiode in the semiconductor layer and located beneath the top surface of the semiconductor layer,
    wherein the transfer gate structure is configured to control charge transfer from the charge collection region to the floating diffusion region.

4. The method of claim 3 further comprising:
    before the charge collection region and the floating diffusion region are formed, forming a dummy gate on the top surface of the semiconductor layer at an intended location for the transfer gate structure,
    wherein the dummy gate is subsequently removed and the first gate dielectric and the first gate electrode are formed at the intended location formerly occupied by the dummy gate.

* * * * *